Oct. 12, 1971 J. NIER 3,611,555

METHOD OF ASSEMBLING A SEMICONDUCTOR DEVICE

Filed Jan. 16, 1970

INVENTOR:
Johannes NIER

By [signature]
his ATTORNEY

United States Patent Office 3,611,555
Patented Oct. 12, 1971

3,611,555
METHOD OF ASSEMBLING A SEMICONDUCTOR DEVICE

Johannes Nier, Stuttgart-Weilimdorf, Germany, assignor to Robert Bosch GmbH, Stuttgart, Germany
Filed Jan. 16, 1970, Ser. No. 3,388
Claims priority, application Germany, Jan. 23, 1969, P 19 03 274.7
Int. Cl. B01j 17/00; H01l 1/14
U.S. Cl. 29—591 10 Claims

ABSTRACT OF THE DISCLOSURE

A layer of solder is provided on a surface portion of a carrier. The solder layer is then formed with a depression whose size and outline correspond to the semiconductor element which is to be mounted on the carrier, whereupon the semiconductor element is positioned in the recess and bonded to the carrier by subjecting the solder to requisite thermal energy.

BACKGROUND OF THE INVENTION

The present invention relates generally to semiconductor devices, and more particularly to a method of assembling such devices.

When a semiconductor device is assembled, the semiconductor element must be located in precisely predetermined relationship with reference to its carrier, before it can be soldered to the same. Furthermore, during the actual soldering operation this relationship must remain unchanged in order to assure that simultaneously—or subsequently—the contacts can be properly soldered to preselected surface portions of the semiconductor element. As is well known to those conversant with the art, this is important because the surface areas to which the contacts are to be soldered have quite frequently dimensions which are measured in fractions of millimeters.

Conventionally, a template is employed for the purpose. The template has a recess whose dimensions correspond to those of the semiconductor element and into which the latter is placed. Now the template is brought to requisite position with reference to the carrier and elastically yieldable contacts of requisite configuration are so positioned as to engage the carrier and the semiconductor element, pressing the two together. The semiconductor element is thus positioned and retained in the preselected relationship relative to the carrier, and the template can now be removed preliminary to placing the assembly into a soldering oven.

There are, however, circumstances where it is desirable not to employ the conventional templates, or where this is not even possible. While these are special circumstances and not the rule, they do nevertheless occur and the art has not as yet provided an alternate approach which is usable under these conditions.

SUMMARY OF THE INVENTION

It is, therefore, an object of the present invention to provide such an approach.

More particularly, it is an object of the invention to provide an improved method of assembling semiconductor devices under circumstances where the use of a positioning template is either not desired or not possible.

In pursuance of these objects, and others which will become apparent hereafter, my invention resides in a method of assembling a semiconductor device. Briefly stated, the method comprises the application of a layer of hardenable electrically conductive bonding substance—such as solder—to a surface portion of an electrically conductive carrier. The layer is then formed in an exposed surface thereof with a depression of predetermined size and outline, and a correspondingly configurated semiconductor element is inserted into the depression. Evidently, it will be the size and outline of the semiconductor element which are governing, and the depression will be shaped accordingly.

With the semiconductor element thus located and retained in predetermined orientation with reference to the carrier, bonding is effected between the element and the carrier via the bonding substance, for instance by applying heat if the substance is solder.

If the substance is indeed solder, as will normally be the case, the ready deformability of the solder—usually soft-solder—assures that any sharp edges or corners on the semiconductor element can become readily embedded in the solder material bonding the depression, thereby avoiding any danger of breakage of the semiconductor element on insertion. This is different from the conventional use of templates which consist of hard material and where such danger always exists because of the resistance offered by the template material when the semiconductor element is not in precise registry with the recess prior to insertion.

The layer of bonding substance, hereafter for convenience referred to as solder, can be supplied in sheet-material form or in other suitable manner, for instance by plating the selected surface portion of the carrier with it. A further possibility is to form the carrier itself with a shallow recess, fill this with solder, and then form the depression in the latter.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1A:
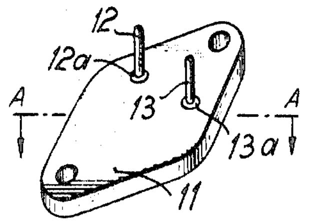
FIG. 1*a* is a perspective view of a carrier.

Discussing now the drawing in detail, it will be seen that reference numeral 11 identifies a carrier, such as the base of a semiconductor device which is to be assembled. It consists of electrically conductive material and in the illustrated example also constitutes an electrical contact for the semiconductor element which is to be secured to it.

In conventional manner two contact pins 12, 13 extend through apertures in the carrier 11 and are retained in the apertures—electrically insulated from the carrier 11—by fused-glass plugs 12*a*, 13*a* which surround them and connect them to the carrier. This is conventional.

Figure 1B:
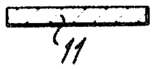
FIG. 1*b* is a section on line A—A of FIG. 1*a*.

The cross-sectional appearance of the carrier is shown in FIG. 1*b*.

Figure 2A:
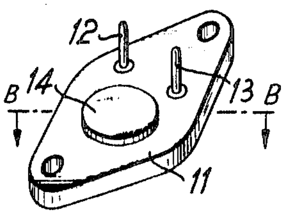
FIG. 2*a* is a perspective view of the carrier with a sheet-material portion of solder applied.
Figure 3A:
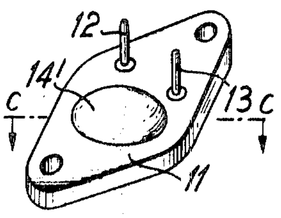
FIG. 3*a* is a perspective view of FIG. 2*a* after the solder is adhered to the carrier.
Figure 2B:
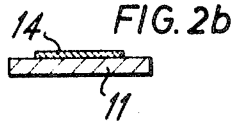
FIG. 2*b* is a section on line B—B of FIG. 2*a*.
Figure 3B:
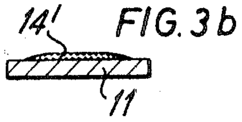
FIG. 3*b* is a section on line C—C of FIG. 3*a*.

Now a sheet material portion or foil 14 of solder is placed onto a surface portion of the carrier where the semiconductor element 10 (see FIGS. 5*a*, 5*b*) is later to be secured as shown in FIGS. 2*a* and 2*b*. The foil 14 may have a thickness of between substantially 20–60$\mu$—or of course any other desired thickness—and the assembly is now subjected to thermal energy—for instance in a soldering oven—with the solder foil 14 now assuming the configuration of a calotte-shaped layer 14' (see FIGS. 3*a*, 3*b*).

Figure 4A:
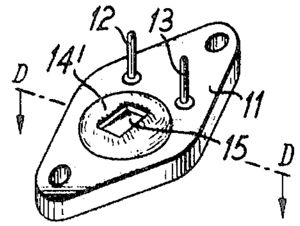
FIG. 4*a* is a perspective view showing the assembly of FIG. 3*a* with a depression formed in the solder.
Figure 4B:
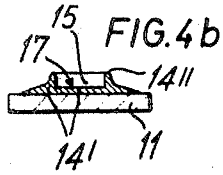
FIG. 4*b* is a section on line D—D of FIG. 4*a*.

In suitable manner, by means of a stamp or the like, the layer 14' is formed with a depression 15 (see FIGS. 4*a* and 4*b*) which is located where the semiconductor element 10 is ultimately to be located.

Figure 5A:
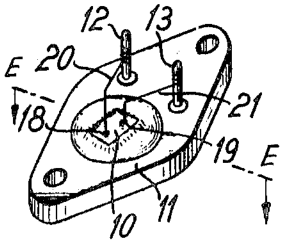
FIG. 5*a* is a perspective view of FIG. 4*a* with the semiconductor element and contacts in place.
Figure 5B:
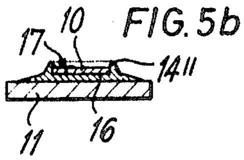
FIG. 5*b* is a section on line E—E of FIG. 5*a*.

Now the semiconductor element 10 is placed into the depression 15 so that its first contact 16—which corresponds to the area of one entire major surface of the element 10—rests in conductive relationship on the bottom surface 17 of depression 15 (see FIG. 5*b*). The opposite contacts 18, 19 are already solder coated and now face upwardly (see FIG. 5*a*).

A pair of thin conductors 20, 21 serve to connect the contacts 18, 19 with the pins 12 and 13, respectively. The conductors 20, 21 are resiliently deformable to at least some extent, and each has a straight center portion, a straight end portion extending at an angle to the center portion (downwardly in FIG. 5*a*) and another end portion which also extends at an angle to the center portion but is helically convoluted. These helically convoluted end portions are slipped over the respective pins 12, 13 (see FIG. 5*a*) and guided with the aid of a (non-illustrated) template in such a manner that the free tips of the respectively other (straight) end portions come to rest on the contacts 18 and 19, respectively. This is shown in FIG. 5*a*. Subsequently the convoluted end portions are downwardly shifted on the respective pins by another increment, so that they become wedged on the pins and the straight end portions exert a clamping pressure via their associated contacts 18 and 19 on the element 10. The latter is thereby pressed against the surface 17 and held immovably.

Figure 6A:
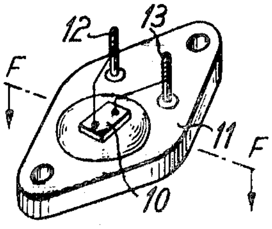
FIG. 6*a* is a perspective view of the finished device.
Figure 6B:
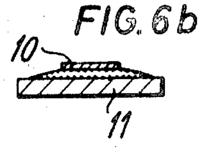
FIG. 6*b* is a section on line F—F of FIG. 6*a*.

Now respective annuli of solder (not shown) are slipped over the pins 12 and 13, the template removed and the assembly of FIGS. 5*a* and 5*b* is inserted into a soldering oven where it is heated to soldering temperature. The solder of the solder annuli melts and connects the convoluted end portions of conductors 19 and 20 to the pins 12 and 13. Similarly, the straight end portions become solder-connected to the contacts 18 and 19, and the upstanding edge portion 14'' of the solder layer 14' (see FIGS. 4*b*, 5*b*) disappear as the layer 14' flows smoothly to assume the configuration of FIGS. 6*a* and 6*b* which show the assembled device.

It will be understood that each of the elements described above, or two or more together, may also find a useful application in other types of constructions differing from the types described above.

While the invention has been illustrated and described as embodied in a method of assembling a semiconductor device, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. A method of assembling a semi-conductor device, comprising the steps of applying a layer of hardenable electrically conductive bonding substance to a surface portion of an electrically conductive carrier; forming in an exposed surface of said layer a depression of predetermined size and outline; inserting into said depression an at least substantially correspondingly configurated semiconductor element so that the same is located and retained in predetermined orientation with reference to said carrier; and effecting bonding of said semi-conductor element to said carrier via the intermediary of said bonding substance.

2. A method as defined in claim 1, wherein said bonding substance is solder.

3. A method as defined in claim 2, wherein the step of forming said depression comprises embossing said exposed surface.

4. A method as defined in claim 2, wherein the step of applying said layer of solder comprises depositing a requisite quantity of solder in sheet form onto said surface portion, and exposing said solder to the influence of heat energy to thereby melt and adhere it to said carrier.

5. A method as defined in claim 2, wherein the step of applying said layer of solder comprises depositing a requisite quantity of solder on said surface portion by plating the latter with said solder.

6. A method as defined in claim 2; further comprising the preliminary step of forming said carrier with a recess whose bottom surface constitutes said surface portion; and thereupon applying said layer of solder by filling said recess with the same.

7. A method as defined in claim 2; further comprising the preliminary step of providing said carrier with a pair of electrically conductive terminals in electrically insulated relationship therewith; and the step of conductively connecting said semi-conductor element with said terminals.

8. A method as defined in claim 7, wherein said terminals are pins projecting from said carrier upwardly beyond said semi-conductive element; and wherein the step of conductively connecting said semi-conductor element with said terminals comprises mechanically and conductively connecting one end portion of a respective electrical conductor to the respective pin, and placing an opposite end portion of the respective electrical conductor into conductive engagement with said semi-conductor element.

9. A method as defined in claim 8, wherein said one end portion of each conductor is convoluted about the respective pin; and further comprising placing an annulus of solder in solid state about the respective pin in contact with the associated one end portion, and subjecting the annulus to the influence of heat energy requisite for effecting melting of the solder of the annulus and soldering of the one end portion to the associated pin.

10. A method as defined in claim 2, wherein said layer of solder has a thickness of between substantially 20 and 60 microns.

References Cited

UNITED STATES PATENTS

| | | | |
|---|---|---|---|
| 3,217,213 | 11/1965 | Slater | 317—234 G |
| 3,303,432 | 2/1967 | Garfinkel et al. | 317—234 A |
| 3,434,018 | 3/1969 | Boczar et al. | 317—234 A |

JOHN F. CAMPBELL, Primary Examiner

W. TUPMAN, Assistant Examiner

U.S. Cl. X.R.

317—234 G; 29—626, 482, 502